United States Patent
Laurens

(10) Patent No.: US 6,235,588 B1
(45) Date of Patent: *May 22, 2001

(54) METHOD OF MANUFACTURING A MEMORY POINT IN BICMOS TECHNOLOGY

(75) Inventor: Michel Laurens, Saint Egréve (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/281,344

(22) Filed: Mar. 30, 1999

(30) Foreign Application Priority Data

Mar. 31, 1998 (FR) .................................. 98 04209

(51) Int. Cl.⁷ .................................. H01L 21/336
(52) U.S. Cl. .................. 438/264; 438/201; 438/203; 438/234; 438/262; 438/263
(58) Field of Search .................. 438/197, 201, 438/258, 199, 305, 262, 263, 264, 202, 203, 234

(56) References Cited

U.S. PATENT DOCUMENTS

| | | |
|---|---|---|
| 5,132,239 | 7/1992 | Ghezzi et al. ........................ 437/43 |
| 5,248,624 | 9/1993 | Icel et al. ........................ 437/31 |
| 5,414,291 * | 5/1995 | Miwa et al. ........................ 257/370 |
| 5,429,960 * | 7/1995 | Hong ........................ 438/261 |
| 5,643,812 | 7/1997 | Park ........................ 437/43 |
| 5,814,857 | 9/1998 | Park ........................ 257/321 |
| 5,834,352 * | 11/1998 | Choi ........................ 438/275 |

FOREIGN PATENT DOCUMENTS

| | | | |
|---|---|---|---|
| 195 31 629 | 1/1997 | (DE) | H01L/21/82 |
| 0 780 902 | 6/1997 | (EP) | H01L/27/11 |

OTHER PUBLICATIONS

French Search Report from French Patent Application 98/04209, filed Mar. 31, 1998.

* cited by examiner

Primary Examiner—Charles Bowers
Assistant Examiner—Hsien-Ming Lee
(74) Attorney, Agent, or Firm—Wolf, Greenfield & Sacks, P.C.; James H. Morris; Theodore E. Galanthay

(57) ABSTRACT

The present invention relates to a method of manufacturing a MOS transistor, including the steps of delimiting, using a first resist mask N-type, drain and source implantation areas; removing the first mask and diffusing the implanted dopant; annealing, so that a thicker oxide forms above the source and drain regions than above the central gate insulation area; forming a polysilicon finger above the central gate insulation portion to form the gate of the MOS transistor; and performing a second source/drain implantation.

19 Claims, 3 Drawing Sheets

METHOD OF MANUFACTURING A MEMORY POINT IN BICMOS TECHNOLOGY

BACKGROUND OF THE INVENTION

1. Field of the Invention

The present invention relates to a method of manufacturing a MOS transistor and more specifically a MOS transistor belonging to a memory point.

The present invention applies in particular to the manufacturing of memory points compatible with conventional CMOS transistor manufacturing methods.

2. Discussion of the Related Art

Floating gate memory points in which the control gate is formed of a layer diffused in a silicon substrate are known. Floating gate memory points with a single polysilicon level may thus be formed. An example of such a memory point is shown in FIG. 1. A MOS transistor T includes a drain region D and a source region S of type $N^+$ formed in a P-type silicon substrate on either side of a gate G formed of a portion of a polysilicon region 10. Besides, polysilicon region 10 extends over a region 11 where it is arranged above an $N^+$-type region 12 formed in the substrate. Of course, when a P-type silicon substrate is mentioned, it may be a proper substrate, or an epitaxial layer on a silicon substrate, or a P-type well formed in a substrate. To simplify, the various connections have not been shown in FIG. 1. A drain terminal connected to region D, a source terminal connected to region S, and a control terminal connected to region 12 should clearly be provided. Such structures are well known in the art and will not be described in further detail hereafter. It should be understood that polysilicon region 10 forms a floating gate of transistor T, this floating gate being capacitively coupled with a control gate 12. The manufacturing method used will essentially be studied.

Conventionally, $N^+$-type region 12 is first formed in the P substrate, possibly at the same time as other regions of the integrated circuit in which the considered structure is formed. Then, after forming, in various locations silicon oxides of appropriate thicknesses, polysilicon region 10 is deposited and etched to form on the one hand region 11 capacitively coupled with control gate 12, and on the other hand, gate G of MOS transistor T. After this, the drain and source regions of the transistor are formed by using, in particular, the gate as a mask. Conventionally, these regions are formed in one or several steps with or without using spacers. It should be noted, especially for so-called flash memories, that the gate oxide under gate portion G is a tunnel oxide of small thickness and that the drain and source regions extend at least partially under the gate.

These various methods have been optimized essentially to promote the constitution of memory points, a great number of which are desired to be formed in a same chip. However, a disadvantage of these methods is to require a great number of manufacturing steps, especially when the source and drain regions are formed from several successive implantations.

SUMMARY OF THE INVENTION

Thus, an object of the present invention is to provide a simple method of manufacturing a floating gate memory point having a single polysilicon level, more specifically realizable by only using the steps conventionally provided for the manufacturing of a CMOS-type or BICMOS-type integrated circuit.

To achieve these objects as well as others, the present invention provides a method of manufacturing a MOS transistor, including the steps of defining, by means of a first resist mask, N-type drain and source implantation areas; removing the first mask and diffusing the implanted dopant; annealing, whereby a thicker oxide forms above the source and drain regions than above the central gate insulation area; forming a polysilicon finger above the central gate insulation portion to form the gate of the MOS transistor; and performing a second source/drain implantation.

According to an embodiment of the present invention, a second source/drain implantation is preceded by the forming of spacers.

According to an embodiment of the present invention, the gate finger is prolonged by a polysilicon region forming a capacitive coupling with a doped region formed in the substrate at the same time as the first N-type dopant implantation.

The present invention provides such a method compatible with the making of a BICMOS-type structure, in which the initial source/drain implantation and the implantation of the capacitive coupling region are performed at the same time as the collector well implantations of the NPN bipolar transistors.

According to an embodiment of the present invention, the transistor is formed in a well completely insulated by regions of the opposite type of conductivity.

The foregoing objects, features and advantages of the present invention, will be discussed in detail in the following non-limiting description of specific embodiments in connection with the accompanying drawings.

DETAILED DESCRIPTION

Figure 1:
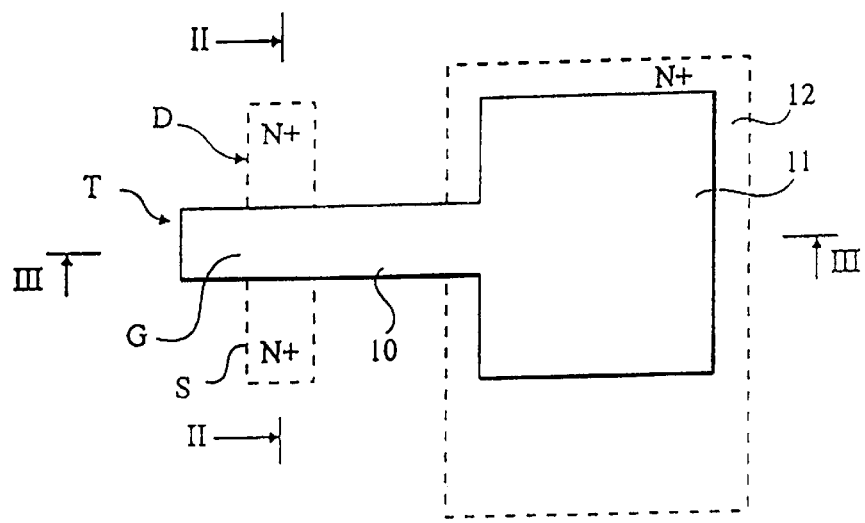
FIG. 1 shows a top view of a floating gate memory point structure with a single polysilicon level that the present invention aims at forming by a new method.
Figure 2A:
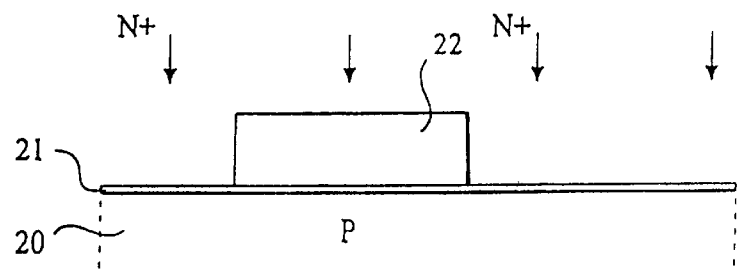
FIGS. 2A to 2E are cross-sectional views along line II—II of FIG. 1 illustrating successive manufacturing steps according to the present invention.

At the step illustrated in FIG. 2A, a resist mask 22 substantially having the shape of the gate to be formed is formed on a P-type single-crystal silicon substrate 20, above a thin oxide layer 21, and an N-type dopant, which corresponds for example to the dopant used in BICMOS circuits to recover contacts with an N-type collector buried layer is implanted at high concentration, this implantation being currently called a collector well implantation or "Nsinker" diffusion. During this implantation step, region 12 illustrated in FIG. 1 is also preferably implanted.

Figure 2B:
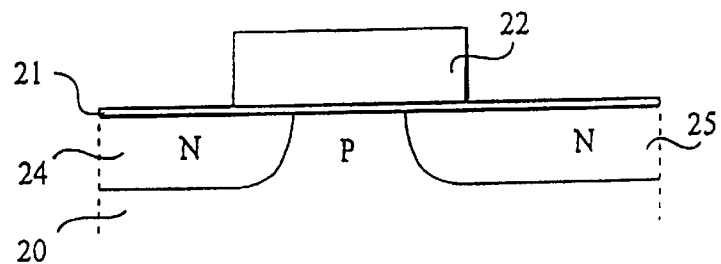

At the step illustrated in FIG. 2B, an anneal has been performed to diffuse the implanted dopant and provide N-type regions 24 and 25 which will form, as will be seen hereafter, drain and source regions. The Nsinker implantation being an implantation meant to provide a drive-in, to join $N^+$-type buried layers, diffused areas 24 and 25 will extend quite widely under the location of resist mask 22.

Figure 2C:
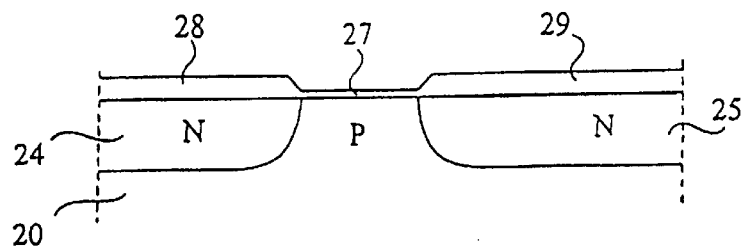

At the step illustrated in FIG. 2C, oxide 21 is cleaned, after which a new thermal oxidation is performed, whereby an oxide layer forms on the substrate surface, this layer being thicker on the heavily-doped N-type regions than above the lightly-doped P-type substrate region. Between regions 24 and 25, a thin oxide layer 27 having a desired thickness to form a tunnel oxide is thus obtained on the substrate, as well as, on either side of region 27, thicker oxide regions 28 and 29, respectively above regions 24 and 25.

Figure 2D:
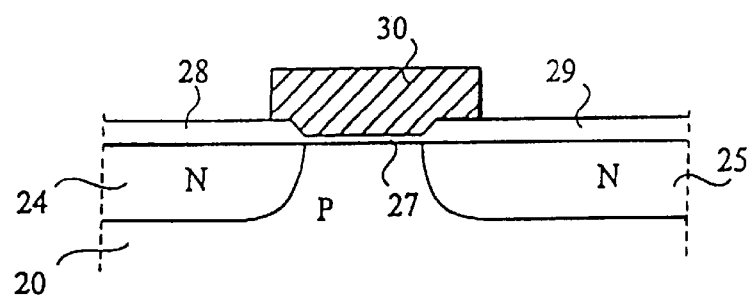

At the step illustrated in FIG. 2D, a polysilicon finger 30 is deposited and etched to cover with certainty the entire thin oxide region 27 and to slightly extend beyond this region. Polysilicon finger 30 is not self-aligned with mask 22. To properly illustrate this fact, polysilicon finger 30 has been shown in an exaggerated manner in FIG. 2D to extend farther to the right-hand side of the drawing than to the left-hand side of the drawing with respect to region 27.

Figure 2E:
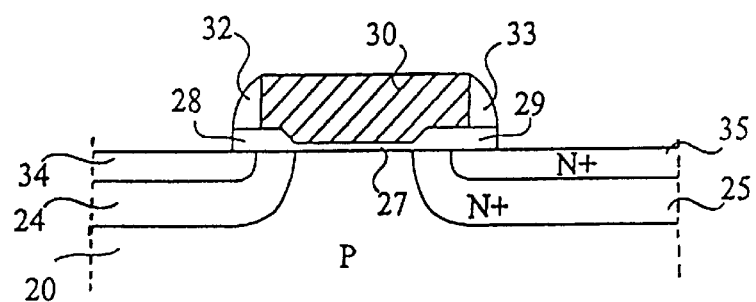

In FIG. 2E, the structure has been shown after the formation of spacers, for example, oxide spacers 32 and 33, on either side of polysilicon finger 30. The silicon oxide portions 28 and 29 are removed outside the area delimited by the spacers. After this, a new implantation of an N-type dopant at a high doping level is performed, and an anneal is performed. Heavily-doped N-type regions 34 and 35 at the surface of source and drain regions are thus obtained inside previously-formed N-type regions 24 and 25. Implantations 34 and 35 are preferably performed at the same time as the source and drain dopant implantations of the other MOS transistors of the CMOS circuit in which the memory point according to the present invention is being made.

During the annealing of regions 34 and 35, regions 24 and 25 diffuse again. The internal limit of these regions thus partially extends under thin oxide layer 27.

A flash-type EEPROM memory point structure has thus been obtained, provided of course that all other elements of the structure shown in FIG. 1 have simultaneously been formed.

In an embodiment of the present invention:

resist finger 22 has a width of 1.8 $\mu$m, thin oxide region 27 has a width of 0.6 $\mu$m, the distance between N$^+$ areas 24 and 25 is approximately 0.3 $\mu$m, polysilicon finger 30 has a width of 0.8 $\mu$m, oxide 27 has a thickness of approximately 12 nm, oxide layers 28 and 29 have a thickness of approximately 24 nm.

Of course, the other current steps of formation of a MOS transistor in a MOS or BICMOS integrated circuit, such as silicidation and contact recovery steps, will be performed conventionally.

Figure 3:
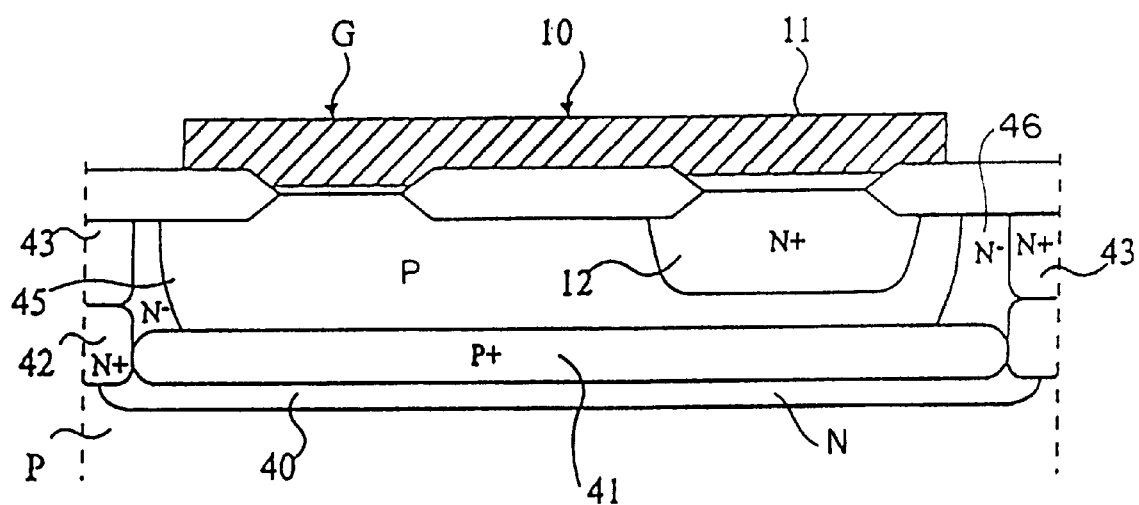
FIG. 3 is a cross-sectional view along line III—III of the structure of FIG. 1 obtained by the method according to the present invention.

FIG. 3 shows a cross-sectional view along line III—III of a finished device according to the present invention. The structure has been shown in the context of a BICMOS-type manufacturing process in which successive buried layers, for example, an N-type insulating layer 40, a P$^+$-type buried layer 41, and an N$^+$-type buried layer 42, have been formed on a P substrate. N$^+$-type well insulation drive-in regions 43 are used to define a structure. The device according to the present invention is formed in a P-type well 45 itself formed in a portion of an N-type epitaxial layer 46. Thus, the P well containing one or several memory points is completely insulated. The cross-sectional view of FIG. 3 shows polysilicon layer 10 including in its left-hand portion gate region G and in its right-hand portion region 11 in capacitive coupling with an N$^+$-type region 12 corresponding to the control gate, this region 12 being formed at the same time as previously-described regions 24 and 25.

It should be noted that, according to the present invention, although the source and drain regions are formed before the corresponding gate region, a self-alignment is obtained between tunnel gate oxide 27 and source and drain regions 24 and 25 and that a possible off-centering due to a misalignment of gate finger 30 has few practical consequences.

With the numerical examples given previously, the programming will be done by injecting hot electrons on the drain side by applying a drain voltage of approximately 5 V and a gate voltage of approximately 12 V. Erasing will be obtained by Fowler-Nordheim tunnel effect by applying a source voltage of approximately 10 V and a substantially null gate voltage, the drain being in the air.

The present invention is likely to have various alterations, modifications, and improvements which will readily occur to those skilled in the art. In particular, the formation of oxide spacers 32 and 33 may be omitted or replaced by an equivalent step used in the considered MOS technology. Silicidation steps may also be provided, for example, a simultaneous silicidation of the gate and of the drains and sources.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a MOS transistor, including the steps of:

defining, by means of a first resist mask, N-type drain and source implantation regions;

implanting a dopant and diffusing the dopant to form the drain and source implantation regions;

removing the first mask;

growing, after removing the first mask, a thicker oxide above the source and drain implantation regions than above the central gate insulation area so that the thicker oxide extends only over the source and drain implantation regions;

forming a polysilicon finger above a central gate insulation portion to form a gate of the MOS transistor; and performing a second source/drain implantation.

2. The method of claim 1, wherein a second source/drain implantation is preceded by the forming of spacers.

3. The method of claim 1, wherein the gate finger is prolonged by a polysilicon region.

4. The method of claim 3, wherein the initial source/drain implantation and the implantation of the capacitive coupling region are performed at the same time as collector well implantations of the NPN bipolar transistors.

5. The method of claim 4, wherein the transistor is formed in a well completely insulated by regions of the opposite type of conductivity.

6. The method of claim 4, further comprising the step of making a BICMOS-type structure.

7. A method of manufacturing a semiconductor device comprising:

defining source and drain implantation regions on a substrate using a mask;

forming source and drain implantation regions within the substrate;

removing the mask; and growing an insulating layer on the substrate, after removing the mask, the insulating layer having a thickness above the source and drain regions greater than a thickness above a gate area between the source and drain regions.

8. The method of claim 7, further comprising forming a polysilicon region above the gate area to form a gate of an MOS transistor after growing the insulating layer.

9. The method of claim 8, wherein the polysilicon region comprises a portion of a polysilicon finger.

10. The method of claim 8, further comprising forming spacers on both sides of the polysilicon region.

11. The method of claim 7, further comprising performing a second source and drain implantation to form heavily doped regions within the source and drain regions after growing the insulating layer.

12. The method of claim 11, further comprising annealing the substrate after performing the second source and drain implantation.

13. The method of claim 7, wherein the thickness of the insulating layer above the majority of the source and drain regions is greater than the thickness of the insulating layer above the gate area.

14. The method of claim 13, wherein the thickness of the insulating layer above the majority of the source and drain regions is approximately two times the thickness of the insulating layer above the gate area.

15. The method of claim 7, wherein the insulating layer is an oxide layer.

16. The method of claim 7, wherein the source and drain regions are n-type.

17. The method of claim 7, wherein the substrate is p-type.

18. The method of claim 7, further comprising forming an MOS transistor.

19. The method of claim 18, wherein the MOS transistor is formed in an insulated well.

* * * * *